(12) United States Patent
Miks et al.

(10) Patent No.: US 7,102,891 B1
(45) Date of Patent: Sep. 5, 2006

(54) CIRCUIT MODULE HAVING INTERCONNECTS FOR CONNECTING FUNCTIONING AND NON-FUNCTIONING ADD ONS AND METHOD THEREFOR

(75) Inventors: Jeffrey Alan Miks, Chandler, AZ (US); John Armando Miranda, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 302 days.

(21) Appl. No.: 10/625,290

(22) Filed: Jul. 23, 2003

(51) Int. Cl.
*H05K 1/14* (2006.01)
(52) U.S. Cl. ..................................... 361/737
(58) Field of Classification Search ............... 361/752, 361/737, 728, 736
See application file for complete search history.

(56) References Cited

U.S. PATENT DOCUMENTS

| | | | |
|---|---|---|---|
| 4,532,419 A | 7/1985 | Takeda | |
| 4,905,124 A | 2/1990 | Banjo et al. | |
| 4,942,550 A * | 7/1990 | Murray | 710/301 |
| 4,974,120 A | 11/1990 | Kodai et al. | |
| 5,513,074 A * | 4/1996 | Ainsbury et al. | 361/737 |
| 5,574,309 A | 11/1996 | Papapietro et al. | |
| 5,742,479 A | 4/1998 | Asakura | |
| 5,784,259 A | 7/1998 | Asakura | |
| 5,822,190 A | 10/1998 | Iwasaki | |
| 6,040,622 A | 3/2000 | Wallace | |
| 6,097,605 A * | 8/2000 | Klatt et al. | 361/737 |
| D445,096 S | 7/2001 | Wallace | |
| D446,525 S | 8/2001 | Okamoto et al. | |
| 6,865,086 B1 * | 3/2005 | Gochnour et al. | 361/737 |
| 6,877,995 B1 * | 4/2005 | Chen | 439/76.1 |

FOREIGN PATENT DOCUMENTS

| | | |
|---|---|---|
| JP | 3-112688 | 5/1991 |
| JP | 07017175 A | 1/1995 |
| JP | 08190615 A | 7/1996 |
| JP | 10-334205 | 12/1998 |
| JP | 11-45959 | 2/1999 |

* cited by examiner

*Primary Examiner*—Kamand Cuneo
*Assistant Examiner*—Ivan Carpio
(74) *Attorney, Agent, or Firm*—Weiss & Moy, P.C.

(57) ABSTRACT

A multi use circuit module has a front half module. The front half module is a functional circuit module having electrical contacts on a front portion there of for electrically coupling the multi use circuit module to a host device. A rear half module is removably coupled to the front half module. The rear half module increases functionality of the multi use circuit module by allowing functional and non functional components to be coupled to the front half module.

11 Claims, 6 Drawing Sheets

CIRCUIT MODULE HAVING INTERCONNECTS FOR CONNECTING FUNCTIONING AND NON-FUNCTIONING ADD ONS AND METHOD THEREFOR

FIELD OF THE INVENTION

This invention relates to circuit module packages and, more specifically, to a circuit module package having interconnects for connecting functioning and non-functioning devices to increase the functionality of the circuit module package.

BACKGROUND OF THE INVENTION

Removable circuit modules or cards are increasing in use to provide storage and other electronic functions for devices such as digital cameras, personal computing devices and personal digital assistants (PDAs). New uses for memory cards include multi-media cards and secure digital cards.

Presently, there are a lot of different form factors for circuit modules. Removable circuit modules which are used to provide storage for different electronic devices come in different sizes and shapes. For example, multimedia cards (MMCs) generally weigh less than two grams and come in a standardized size of 24 mm×32 mm×1.4 mm. MMCs are removable solid-state memory solutions for mobile applications, such as MP3 music players, portable video games, laptop computers, personal digital assistants (PDAs), mobile telephones and digital cameras.

MMCs use ROM technology for read-only applications and Flash technology for read/write applications. MMCs are fast for excellent system performance; energy efficient for prolonged battery life in portable products; and cost-efficient for use in systems sold at consumer price points. MMCs generally have a seven pad (pin) serial interface. This easy-to-install simple serial interface offers easy integration into various devices regardless of the microprocessor used.

A SIMM (single in-line memory module) card is generally smaller and is approximately half the size of a MMC. A SIMM card contains one or more random access memory (RAM) chips on a small circuit board with a plurality of pins that connect to an electronic device like that described above.

Because of the differences in size, SIMM cards cannot not be used in applications which require MMCs. SIMM cards are generally approximately half the size of an MMC, thus, one cannot remove a SIMM card from a device and plug it into another device that uses an MMC. Thus, circuit modules are restricted to certain applications due to sizing differences. Thus, it is desirable to increase the functionality of current circuit modules by providing a means to standardize the size of all current circuit modules.

Removable circuit modules may also be designed to function as modular input/output (I/O) cards. These cards may be used allow different I/O devices to be plugged into and interact with an electronic device like a mobile phone, PDA, digital camera and the like. For example, I/O cards have been designed to allow PDAs to function as a digital camera, an MP3 player, a modem, and the like. However, each I/O card is designed to perform a specific function. Each I/O card requires creating a new card form factor which requires incurring a large capital expense.

The problem with present circuit modules is that there is not a way to add on additional components (functional as well as non functional) to the circuit modules. Thus, it's difficult to expand the flexibility of usage for present circuit modules.

Therefore, a need existed to provide a circuit module and method to overcome the above problems.

SUMMARY OF THE INVENTION

A multi use circuit module has a front half module. The front half module is a functional circuit module having electrical contacts on a front portion there of for electrically coupling the multi use circuit module to a host device. A rear half module is removably coupled to the front half module. The rear half module increases functionality of the multi use circuit module by allowing functional and non functional components to be coupled to the front half module.

The present invention is best understood by reference to the following detailed description when read in conjunction with the accompanying drawings.

BRIEF DESCRIPTION OF THE DRAWINGS

Common reference numerals are used throughout the drawings and detailed description to indicate like elements.

DETAILED DESCRIPTION

Figure 1:
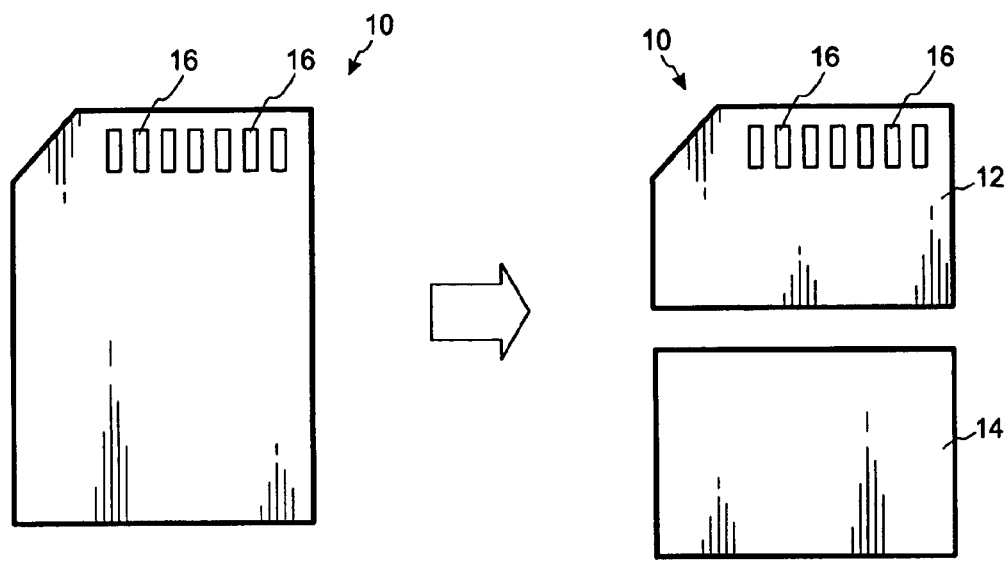
FIG. 1 is a simplified block diagram of one embodiment of the circuit module of the present invention.

Referring to FIG. 1, one embodiment of a circuit module 10 is shown. The circuit module 10 is comprised of two separate halves. The circuit module 10 will have a front half 12. The front half 12 can be any type of functional prior art circuit module. For example, the front half 12 may be a multi-media card (MMC), single inline memory module (SIMM), compact flash card, secured digital (SD) card, and the like. It should be noted that the listing of the above should not be seen as to limit the scope of the present embodiment. Other types of prior art circuit modules may be used for the front half 12 without departing from the spirit and scope of the present invention.

A rear half 14 is removably coupled to the front half 12. The front half 12 and the rear half 14 will be coupled together to form the circuit module 10 of a desired form factor. The circuit module 10 has increased functionality since one can standardize the size of all prior art circuit modules. Further, one can increase functionality of the circuit module 10 by connecting different functioning rear halves 14. Additional functions can be added to the circuit module 10 without one having to remove the circuit module 10 from a host device. This will be described later.

As stated above, the front half 12 can be any type of functional prior art circuit module. The front half 12 will generally be comprised of a substrate. Integrated circuit dies are attached to the substrate. Circuit terminals (contacts) 16 are electrically connected to the integrated circuit dies by conductive patterns within the substrate. The substrate assembly forms the electronic portion of the front half 12, which must be packaged with a housing which covers the top and edges and optionally the bottom of the front half 12.

In accordance with one embodiment of the present invention, the rear half 14 is a non-functional component. As stated above, the rear half 14 is coupled to the front half 12 in order to increase the functionality of the functioning front half 12. Functionality increases by allowing the front half 12 to be used in a plurality of different applications. For example, if the front half 12 is a SIMM card, SIMM cards are generally approximately half the size of a MMC. Thus, one cannot remove a SIMM card from a device and plug it into another device that uses a MMC. However, by coupling the rear half 14 to the front half 12 which is a SIMM card, the circuit module 10 now becomes the size of a standard MMC. Thus, one can now use the SIMM card in an MMC device since the size of the SIMM card is no longer an issue.

Figure 2A:
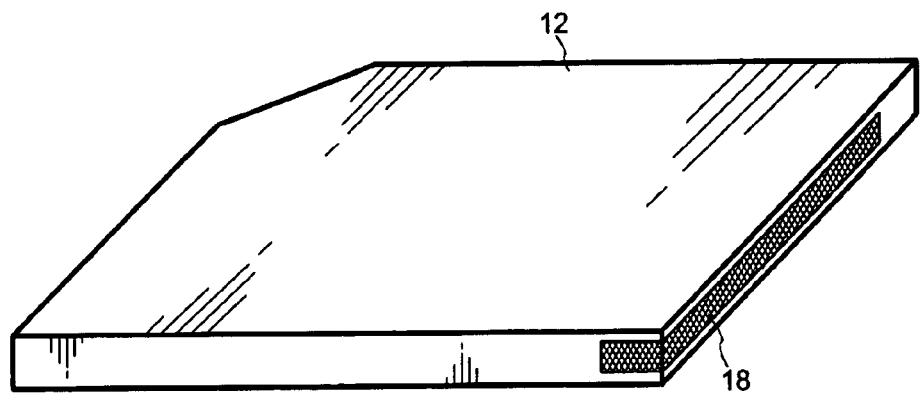
FIG. 2A is an elevated perspective view of the front half of the circuit module depicted in FIG. 1.
Figure 2B:
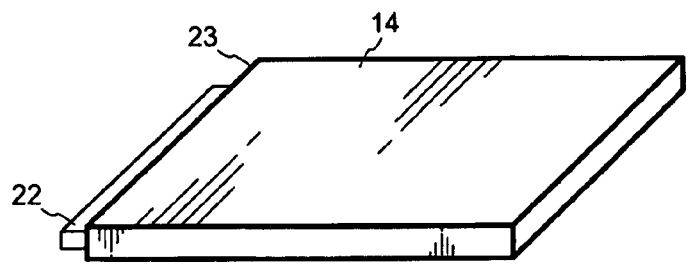
FIG. 2B is an elevated perspective view of the rear half of the circuit module depicted in FIG. 1.

As stated above, the front half 12 and the rear half 14 are coupled together to form the circuit module 10 of a desired form factor. The front half 12 and the rear half 14 may be coupled together in a plurality of different manners. Referring now to FIGS. 2A–2B, one embodiment will be described as to how the front half 12 and the rear half 14 may be coupled together. The front half 12 will have a channeling 18. The channeling 18 is formed on a rear section 20 of the front half 12. The channeling 18 extends from a first side of the front half 12 along a majority of the length of the front half 12. The channeling 18 will allow the rear half 14 to be inserted and coupled to the front half 12.

The rear half 14 will have a tab member 22. The tab member 22 will extend out from a front portion 23 of the rear half. The tab member 22 slides into the channeling 18 of the front half 12 thereby coupling the front half 12 to the rear half 14. A locking device may be used to ensure that the front half 12 stays coupled to the rear half 14.

Figure 3:
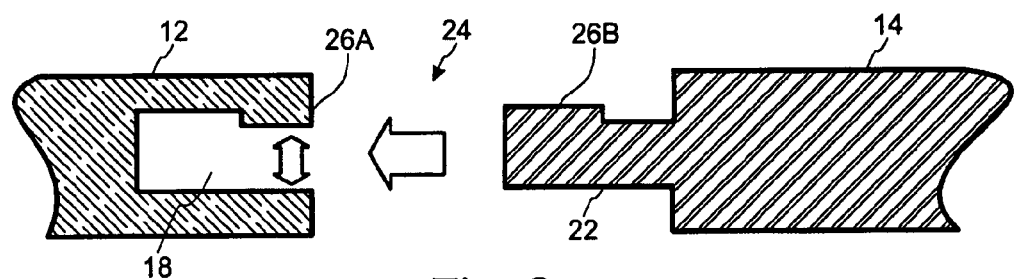
FIG. 3 is a side view depicting one embodiment of the interconnect between the front half and the rear half of the circuit module depicted in FIG. 1.

Referring to FIG. 3, one embodiment of a locking device 24 is shown. As stated above, the locking device 24 is used to ensure that the front half 12 stays coupled to the rear half 14. The locking device 24 is comprised of two locking tabs 26. The first locking tab 26A extends in a downward manner from the channeling 18. The second locking tab 26B extends in an upward manner from the tab member 22. When the tab member 22 slides into the channeling 18 of the front half 12, the first locking tab 26A and the second locking tab 26B will engage one another so that the rear half 14 cannot be removed from the front half 12. The only way to disengage the rear half 14 from the front half 12 is to slide the rear half 14 out of the channeling 18.

Figure 4:
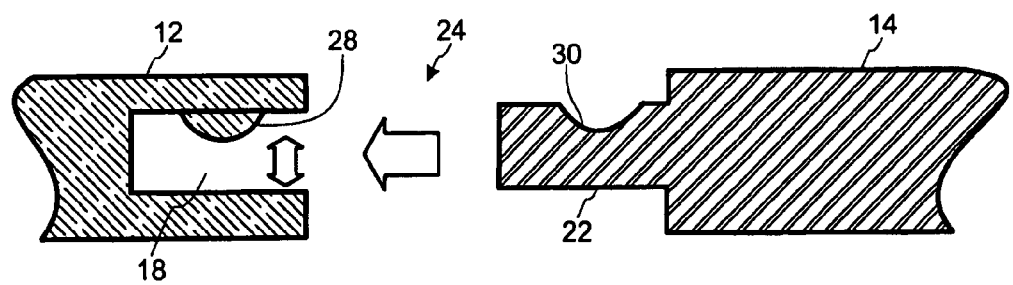
FIG. 4 is a side view depicting one embodiment of the interconnect between the front half and the rear half of the circuit module depicted in FIG. 1.

Referring to FIG. 4, another embodiment of the locking device 24 is shown. In this embodiment, the locking device 24 has a locking ball 28. The locking ball 28 is formed within the channeling 18 and extends in a downward fashion. The locking ball 28 is generally semi-spherical in shape. However, this should not be seen as to limit the scope of the present invention. The locking ball 28 may come in other sizes and shape without departing from the spirit and scope of the present invention. The tab member 22 has a small indentation 30 similar in size and shape to the locking ball 28. When the tab member 22 slides into the channeling 18 of the front half 12, the locking ball 28 and the indentation 30 will engage one another so that the rear half 14 cannot be removed from the front half 12. The only way to disengage the rear half 14 from the front half 12 is to slide the rear half 14 out of the channeling 18.

Figure 5A:
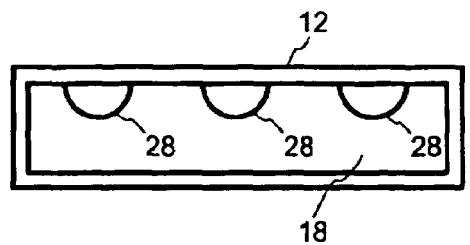
FIG. 5A is an end view depicting one embodiment of the interconnect between the front half and the rear half of the circuit module depicted in FIG. 1.
Figure 5B:
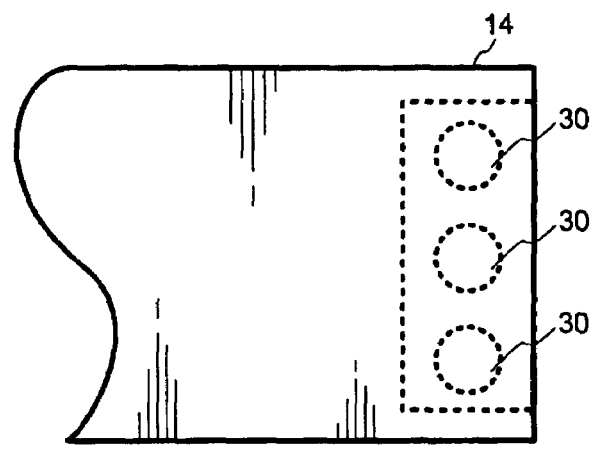
FIG. 5B is a top view depicting the embodiment FIG. 5A.

Referring to FIGS. 5A–5B, another embodiment of the locking device 24 is shown. This embodiment is similar to that shown in FIG. 4. The main difference is that the locking device 24 has a plurality of locking balls 28 located along the length of the channeling 18. The locking balls 28 are formed within the channeling 18 and extend in a downward fashion. The locking balls 28 are generally semi-spherical in shape. However, this should not be seen as to limit the scope of the present invention. The locking balls 28 may come in other sizes and shape without departing from the spirit and scope of the present invention. The tab member 22 has a plurality of small indentations 30 similar in size and shape to the locking balls 28. When the tab member 22 slides into the channeling 18 of the front half 12, the locking balls 28 and the indentations 30 will engage one another so that the rear half 14 cannot be removed from the front half 12. The only way to disengage the rear half 14 from the front half 12 is to slide the rear half 14 out of the channeling 18.

Figure 6A:
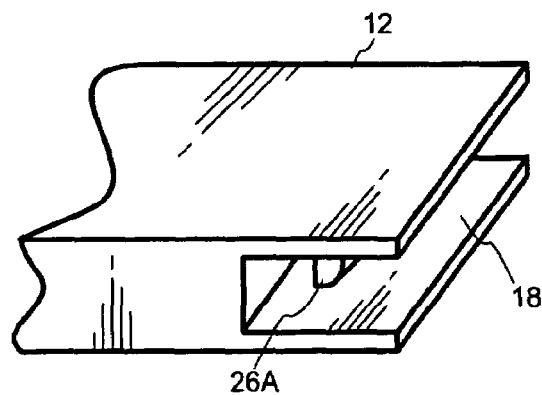
FIG. 6A is an end view depicting one embodiment of the interconnect between the front half and the rear half of the circuit module depicted in FIG. 1.
Figure 6B:
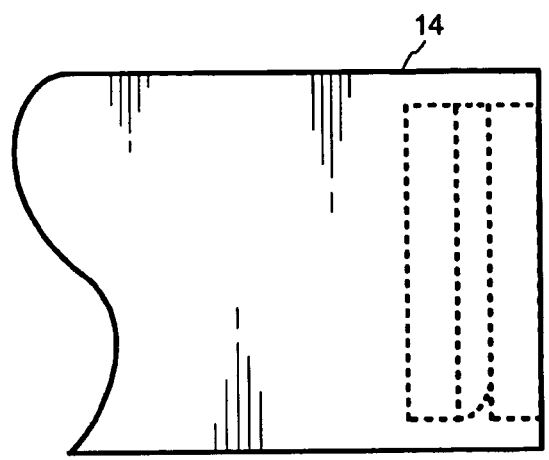
FIG. 6B is a top view depicting the embodiment FIG. 6A.
Figure 7:
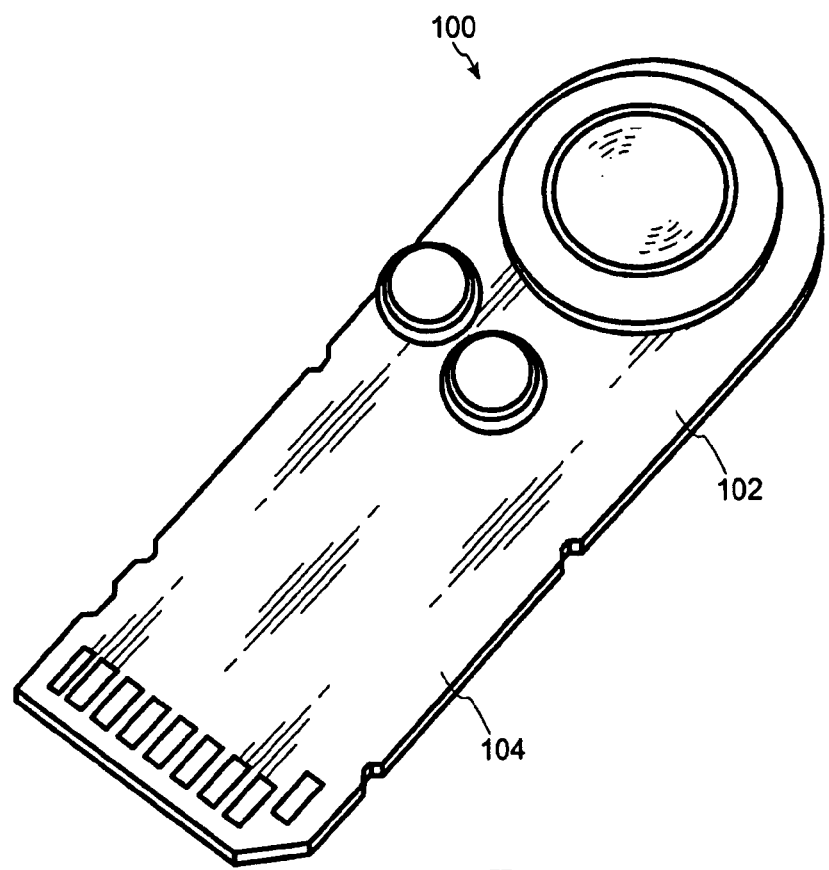
FIG. 7 is an elevated perspective view of a second embodiment of the circuit module of the present invention.
Figure 8A:
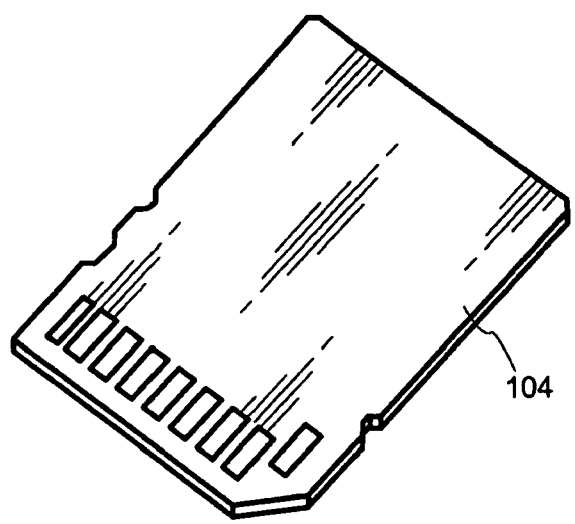
FIG. 8A is an elevated perspective view of the front half of the circuit module depicted in FIG. 7.
Figure 8B:
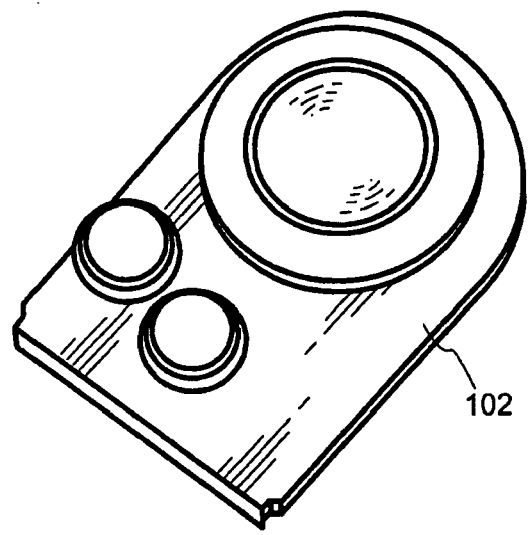
FIG. 8B is an elevated perspective view of the rear half of the circuit module depicted in FIG. 7.
Figure 9:
FIG. 9 is an end view of the front half of the circuit module depicted in FIG. 7 showing the interconnect on the front half.

Referring to FIGS. 6A–6B, another embodiment of a locking device 24 is shown. The embodiment in FIGS. 6a–6B is similar to that shown in FIG. 3. The locking device 24 is comprised of two locking tabs 26. The first locking tab 26A extends in a downward manner from the channeling 18. The locking tab 26A is formed in a "D" shape and runs the length of the channeling 18. The second locking tab 26B extends in an upward manner from the tab member 22. When the tab member 22 slides into the channeling 18 of the front half 12, the first locking tab 26A and the second locking tab 26B will engage one another so that the rear half 14 cannot be removed from the front half 12. The only way to disengage the rear half 14 from the front half 12 is to slide the rear half 14 out of the channeling 18.

Referring to FIGS. 7–9B, another embodiment of the present invention is shown. The circuit module 100 is similar to the embodiment described above. The circuit module 100 is comprised of two separate halves. The circuit module 100 will have a front half 102. The front half 102 can be any type of functional prior art circuit module. For example, the front half 102 may be a multi-media card (MMC), single inline memory module (SIMM), compact flash card, secured digital (SD) card, and the like. It should be noted that the listing of the above should not be seen as to limit the scope of the present embodiment. Other types of prior art circuit modules may be used for the front half 102 without departing from the spirit and scope of the present invention.

A rear half 104 is removably coupled to the front half 102. The front half 102 and the rear half 104 will be coupled together to form the circuit module 100 of a desired form factor. The main difference is that in this embodiment, the rear half 104 is an I/O device. Thus, the circuit module 100 has increased functionality by connecting different functioning rear halves 104. Additional functions can be added to the circuit module 100 without one having to remove the circuit module 10 from a host device.

The front half 102 will generally be comprised of a substrate. Integrated circuit dies are attached to the substrate. Circuit terminals (contacts) 106 are electrically connected to the integrated circuit dies by conductive patterns within the substrate. The substrate assembly forms the electronic portion of the front half, which must be packaged with a housing which covers the top and edges and optionally the bottom of the front half 102. The main difference between the present embodiment and the embodiments described above is that the front half 102 will have an edge connector 120 (see FIG. 9). The edge connector 120 is electrically connected to the integrated circuit dies by conductive patterns within the substrate. The edge connector 120 will allow additional I/O devices to be coupled to the front half 102 to increase functionality without one having to remove the circuit module 100 from the host device. The edge connector 120 will have contacts either on the top, bottom or on both sides of the edge connector 120.

Figure 10:
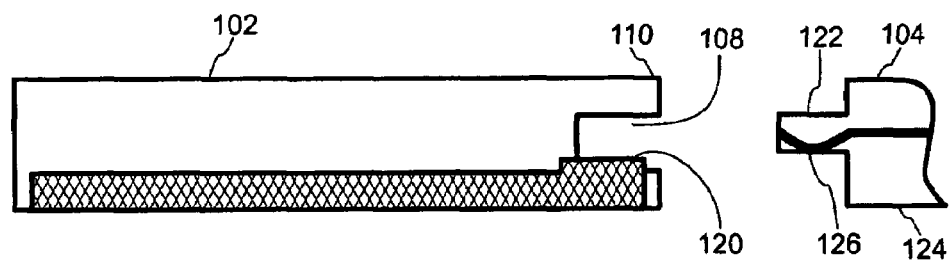
FIG. 10 is a side view depicting one embodiment of the interconnect between the front half and the rear half of the circuit module depicted in FIG. 7.

As stated above, the front half 102 and the rear half 104 are coupled together to form the circuit module 100 of a desired form factor. The front half 102 and the rear half 104 may be coupled together in a plurality of different manners. Referring now to FIG. 10, one embodiment will be described as to how the front half 102 and the rear half 104 may be coupled together. The first half 102 will have a channeling 108. The channeling 108 is formed on a rear section 110 of the front half 102. The channeling 108 extends from a first side of the front half 102 along a majority of the length of the front half 102. The channeling 108 will allow the rear half 104 to be inserted and coupled to the front half 102. Located in the channeling 108 is an edge connector 120. The edge connector 120 is electrically connected to the integrated circuit dies. The edge connector 120 is electrically connected to the circuit dies by conductive patterns within the substrate or by wire bonds. The edge connector 120 is generally an exposed metal which will allow for an electrical connection between a mating piece of the rear half 104. Thus, the edge connector 120 will allow for an electrical connection between the front half 102 and the rear half 104.

As stated above, the rear half 104 is a functioning I/O device. The rear half 104 will have a tab member 122. The tab member 122 will extend out from a front portion 124 of the rear half. The tab member 122 fits within the channeling 108 of the front half 102 thereby coupling the front half 102 to the rear half 104. The tab member 122 will have a contact 126. The contact 126 will be electrically coupled to the edge connector 120 when the tab member 122 is inserted into the channeling 108 of the front half 102. Thus, the I/O device which is the rear half 104 is electrically coupled to the front half 102. In the embodiment depicted in FIG. 10, the contact 126 is a spring loaded contact. However, this should not be seen as to limit the scope of the present invention. Other types of contacts 126 may be used to electrically couple the I/O device of the rear half 104 to the front half 102 without departing from the spirit and scope of the present invention.

Figure 11:
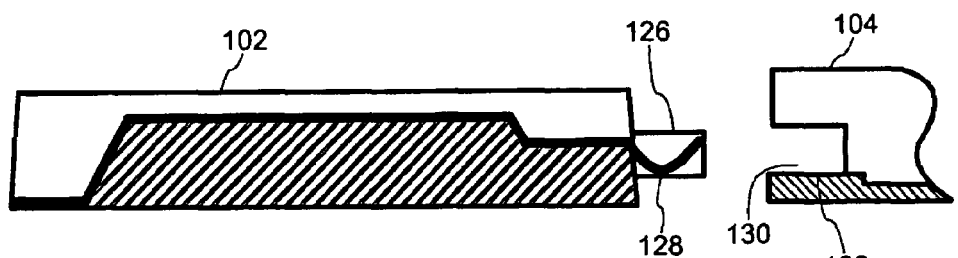
FIG. 11 is an elevated perspective view of a second embodiment of the circuit module of the present invention.

Referring to FIG. 11, another embodiment of the present invention is shown. In this embodiment, the front half 102 has a tab member 126 extending out from a rear section of the front half 102. The tab member 126 will have a connector 128 coupled to a bottom section of the tab member 126. The connector 128 is electrically coupled to the integrated circuit dies of the front half 102. The rear half 104 has a channeling 130 formed in a front section of the rear half 104. The channeling 130 will have an edge contact 132 formed on the channeling 130 wherein the edge contact 132 may be on the top, bottom or both sides of the channeling. The edge contact 132 will allow an electrical connection between the edge contact 132 and the connector 128 when the tab member 126 is inserted into the channeling 130. Thus, the I/O device which is the rear half 104 is electrically coupled to the front half 102. In the embodiment depicted in FIG. 11, the connector 128 is a spring loaded contact. However, this should not be seen as to limit the scope of the present invention. Other types of connectors 128 may be used to electrically couple the I/O device of the rear half 104 to the front half 102 without departing from the spirit and scope of the present invention.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A multi use circuit module comprising:
   a front half module, the front half module being a functional circuit module having electrical contacts on a front portion thereof, the front half module having a channeling formed on the rear section thereof, the channeling running from a side wall of the front half module along a length of the front half module;
   a rear half module removably coupled to the front half module, a tab member formed on a front portion of the rear half module;
   at least one locking ball formed on a surface within the channeling; and
   at least one indentation formed on the tab member, the at least one indentation being similar in size and shape to the at least one locking ball and mating with the at least one locking ball when the tab member is slid within the channeling to lock the front half module to the rear half module.

2. A multi use circuit module in accordance with claim 1 wherein the rear half module is an electrically non-functional component, the rear half module being coupled to the front half module to standardize a size of the multi use circuit module.

3. A multi use circuit module in accordance with claim 1 wherein the at least one locking ball extends downward form a top surface of the channeling.

4. A multi use circuit module in accordance with claim 3 wherein the at least one indentation is formed on a top surface of the tab member.

5. A multi use circuit module in accordance with claim 1 wherein the at least one locking ball is semi-spherical in shape.

6. A multi use circuit module in accordance with claim 1 wherein the front half module is a memory card, the rear half module removably coupled to the front half module to standardize a size of the memory card.

7. A multi use circuit module in accordance with claim 1 further comprising:

a plurality of locking balls formed on a surface within the channeling; and a plurality of indentations formed on the tab member, the indentations being similar in size and shape to the locking balls and mating with the locking balls when the tab member is slid within the channeling to lock the front half module to the rear half module.

8. A multi use circuit module in accordance with claim 7 wherein the locking balls extend downward form a top surface of the channeling.

9. A multi use circuit module in accordance with claim 8 wherein the indentations are formed on a top surface of the tab member.

10. A multi use circuit module in accordance with claim 7 wherein the locking balls are semi-spherical in shape.

11. A multi use circuit module in accordance with claim 1 wherein the rear half module is an electrically non-functional component.

* * * * *